(12) United States Patent
Jang et al.

(10) Patent No.: US 12,437,680 B2
(45) Date of Patent: Oct. 7, 2025

(54) STRETCHABLE SUBSTRATE

(71) Applicants: KOREA INSTITUTE OF MACHINERY & MATERIALS, Daejeon (KR); CENTER FOR ADVANCED META-MATERIALS, Daejeon (KR)

(72) Inventors: Bongkyun Jang, Daejeon (KR); Sejeong Won, Daejeon (KR); Jaegu Kim, Daejeon (KR); Jae-Hyun Kim, Daejeon (KR); Hak Joo Lee, Daejeon (KR); Minwoo Kweun, Daejeon (KR); Kwangseop Kim, Daejeon (KR)

(73) Assignees: KOREA INSTITUTE OF MACHINERY & MATERIALS, Daejeon (KR); CENTER FOR ADVANCED META-MATERIALS, Daejeon (KR)

( * ) Notice: Subject to any disclaimer, the term of this patent is extended or adjusted under 35 U.S.C. 154(b) by 233 days.

(21) Appl. No.: 18/016,480

(22) PCT Filed: Aug. 31, 2021

(86) PCT No.: PCT/KR2021/011707
§ 371 (c)(1),
(2) Date: Jan. 17, 2023

(87) PCT Pub. No.: WO2022/045871
PCT Pub. Date: Mar. 3, 2022

(65) Prior Publication Data
US 2023/0298489 A1   Sep. 21, 2023

(30) Foreign Application Priority Data
Aug. 31, 2020 (KR) .................. 10-2020-0110492

(51) Int. Cl.
G09F 9/00 (2006.01)
G09F 9/30 (2006.01)

(52) U.S. Cl.
CPC ..................... *G09F 9/301* (2013.01)

(58) Field of Classification Search
None
See application file for complete search history.

(56) References Cited

U.S. PATENT DOCUMENTS 7,851,819 B2 * 12/2010 Shi .................. H01L 33/507
438/26
9,504,139 B2 * 11/2016 Ogura .............. H05K 1/0274
(Continued)

FOREIGN PATENT DOCUMENTS

JP   2015-198102   11/2015
JP   2020-047959   3/2020
(Continued)

*Primary Examiner* — Imani N Hayman
*Assistant Examiner* — Rashen E Morrison
(74) *Attorney, Agent, or Firm* — LEX IP MEISTER, PLLC

(57) ABSTRACT

An embodiment of the present invention provides a stretchable substrate that may be significantly stretchable to be deformed but have a low rate of breakage. Here, the stretchable substrate includes a cell, a cut portion, and an extended cut line. A plurality of cells are formed in the substrate body, and a device is mounted thereon. The cut portion is formed in the substrate body to increase a distance between the cells when the substrate body is stretched. The extended cutting line is formed to extend from an end portion of the cut portion and bent inwardly of the cell so that corners of the cells are rounded.

5 Claims, 11 Drawing Sheets

(56) References Cited

U.S. PATENT DOCUMENTS

| | | | | |
|---|---|---|---|---|
| 10,055,067 B2 * | 8/2018 | Shinkai | ................. | G06F 3/0445 |
| 10,466,746 B2 * | 11/2019 | Hong | ..................... | H10K 59/40 |
| 10,802,545 B2 * | 10/2020 | Hong | .................... | G06F 1/1652 |
| 10,959,326 B2 * | 3/2021 | Okimoto | ................ | H05K 1/118 |

FOREIGN PATENT DOCUMENTS

| | | |
|---|---|---|
| JP | 2020-107660 | 7/2020 |
| KR | 10-2016-0110689 | 9/2016 |
| KR | 10-2020-0049949 | 5/2020 |

* cited by examiner (a)

STRETCHABLE SUBSTRATE

TECHNICAL FIELD

The present invention relates to a stretchable substrate, and more particularly, to a stretchable substrate that may be significantly stretchable to be deformed but have a low rate of breakage.

BACKGROUND ART

In general, attempts have been made to manufacture flexible device parts based on printed electronics technology, and examples of application thereof to some product groups, such as displays, RFID, and photovoltaic power generation, have been introduced. Printed electronics technology is generally conducted at a relatively low temperature or room temperature compared to a semiconductor process, and devices are manufactured by a coating process, a printing process, a patterning process, etc. and post-processing for wiring and electrode formation and processes, such as bonding and cutting are performed to obtain flexible parts.

Flexible displays using a flexible material, such as plastic, instead of an existing inflexible glass substrate, may maintain display performance even when bent, and thus, flexible displays have been widely used as display devices for implementing flexible device components.

Recently, stretchable displays have also been widely used. The stretchable display may be restored to its original shape even after being stretched up, down, left and right, and due to this characteristic, stretchable displays have been widely applied to implement a free form that may be mountable on three-dimensional surfaces, such as clothes and automobiles.

In addition, the flexible displays are considered as promising next-generation display technology because the flexible displays may realize a more free form factor than general flexible display devices, further expanding a display usable area.

Meanwhile, Korean Patent Laid-Open Publication No. 2020-0049949 (hereinafter, referred to as 'related art') discloses a sheet in which a plurality of quarter body portions are formed by a first cutting line and a second cutting line, and move so that a distance between centers of the plurality of quarter body portions become away when the first cutting line and the second cutting line are spread apart. However, the first and second cutting lines of the related art are simply formed to be perpendicular to the body portion. Therefore, as in FIG. 2 of the related art, when the quarter body portion is rotated while the first and second cutting lines are spread apart, maximum strain of a connection portion which is a rotation center of the quarter body portion, while connecting the quarter body portions, may increase. The increase in the maximum strain may cause an increase in stress of the connection portion, leading to a problem in that a rate of breakage of the connection portion may be increased.

DISCLOSURE

Technical Problem

The present invention has been made in an effort to provide a stretchable substrate having advantages of being significantly stretchable to be deformed but having a low rate of breakage The technical problems to be achieved by the present invention are not limited to the technical problems mentioned above, and other technical problems not mentioned may be clearly understood by those skilled in the art to which the present invention pertains from the description below.

Technical Solution

An exemplary embodiment of the present invention provides a stretchable substrate including: a plurality of cells formed on a substrate body allowing a device to mounted thereon; a cut portion formed in the substrate body to increase a distance between the cells when the substrate body is stretched; and an extended cutting line extending from an end portion of the cut portion and bent inwardly of the cell so that corners of the cells are rounded.

In an exemplary embodiment of the present invention, the cut portion may include: a first basic cutting line formed on the substrate body in a first direction; a second basic cutting line symmetrically formed on both sides of a center of the first basic cutting line in the substrate body in a second direction intersecting the first direction; and a plurality of sub-cutting lines extending along the edge of the cell in an inside of the cell and not connected to each other but spaced apart from each other, wherein the extended cutting line is formed at an end portion of each of the sub-cutting lines.

In an exemplary embodiment of the present invention, the extended cutting lines formed in cells formed in the first and third quadrants based on the first and second basic cutting lines, among the plurality of cells, may extend to be bent in a first rotation direction, and the extended cutting lines formed in cells formed in the second and fourth quadrants based on the first and second basic cutting lines, among the plurality of cells, may extend to be bent in a second rotation direction.

In an exemplary embodiment of the present invention, a ratio of a thickness of the substrate body to an interval between end portions of the sub-cutting line and the extended cutting line adjacent to the sub-cutting line may exceed 1.

In an exemplary embodiment of the present invention, the sub-cutting line may include a pair of first sub-cutting lines extending from the inside of the cell in the first direction along the edge of the cell and a pair of second sub-cutting lines extending from the inside of the cell in the second direction along the edge of the cell, wherein a first sub-cutting line disposed closer to the first basic cutting line, among the first sub-cutting lines, is vertically connected to the second basic cutting line, and a second sub-cutting line disposed farther from the second basic cutting line, among the second sub-cutting lines, is vertically connected to the first sub-cutting line.

In an exemplary embodiment of the present invention, an electrode wiring may be continuously provided on the plurality of cells not to cross the cut portion, and the electrode wiring may maintain a continuous state even when an interval between the cells is changed.

Advantageous Effects

According to an exemplary embodiment of the present invention, the stretchable substrate may include a sub-cutting line and an extended cutting line extending to be bent from the sub-cutting line to the inside of the cell so that the edge of the cell is rounded. Accordingly, a maximum strain of a hinge portion of the stretchable substrate may be lowered, and thus, greater stretching deformation may be achieved and the rate of breakage may be lowered.

It should be understood that the effects of the present invention are not limited to the effects described above and include all effects that may be inferred from the configuration of the present invention described in the detailed description or claims of the present invention.

MODE FOR INVENTION

Figure 1:
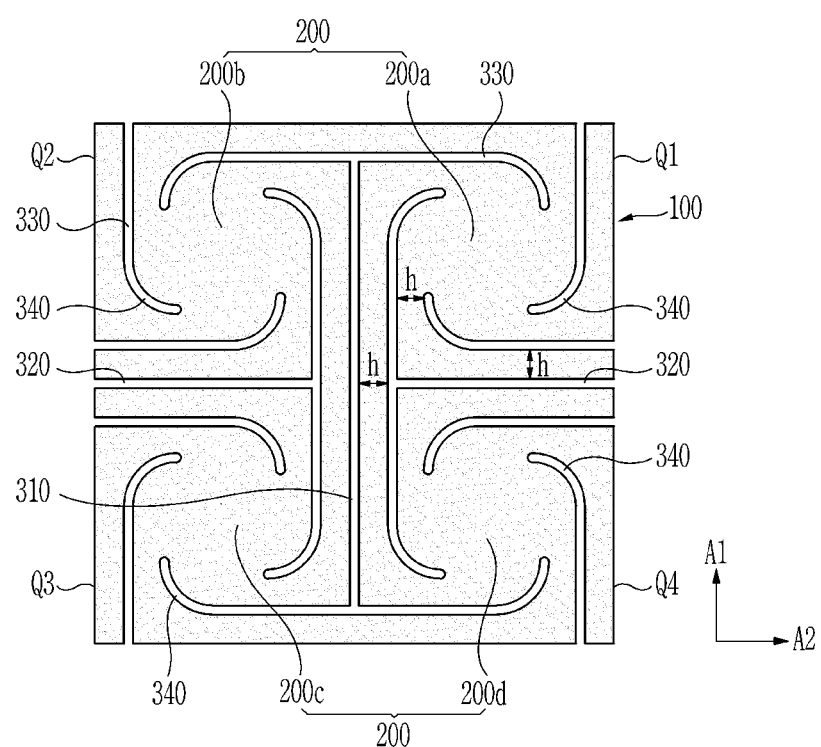
FIG. 1 is an exemplary view showing a stretchable substrate according to an exemplary embodiment of the present invention.

Hereinafter, the present invention will be described with reference to the accompanying drawings. As those skilled in the art would realize, the described exemplary embodiments may be modified in various different ways, all without departing from the scope of the present invention. Accordingly, the drawings and description are to be regarded as illustrative in nature and not restrictive. Like reference numerals designate like elements throughout the specification.

Throughout this specification and the claims that follow, when it is described that an element is "connected (accessed, contact, and coupled)" to another element, the element may be "directly connected" to the other element and "indirectly connected" to the other element through a third element. Throughout the specification, unless explicitly described to the contrary, the word "comprise" and variations, such as "comprises" or "comprising" will be understood to imply the inclusion of stated elements but not the exclusion of any other elements.

Terms used in the present specification are used only in order to describe specific exemplary embodiments rather than limiting the present invention. Singular forms are intended to include plural forms unless the context clearly indicates otherwise. It will be further understood that the terms "comprises" or "have" used in this specification, specify the presence of stated features, numerals, components, parts, or a combination thereof, but do not preclude the presence or addition of one or more other features, numerals, components, parts, or a combination thereof.

Hereinafter, preferred exemplary embodiments of the present invention will be described in detail with reference to the accompanying drawings.

Figure 2:
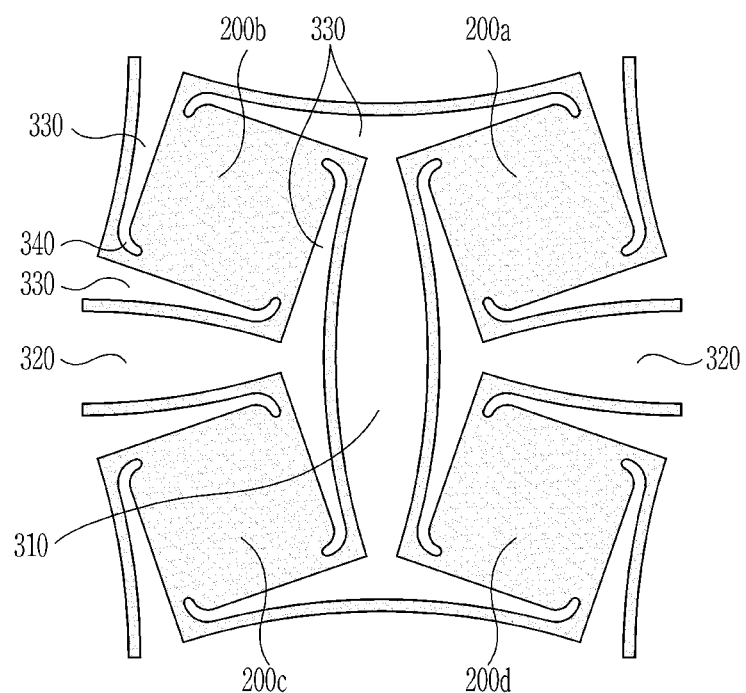
FIG. 2 is an exemplary view illustrating a state in which the stretchable substrate of FIG. 1 is stretched.

FIG. 1 is an exemplary view showing a stretchable substrate according to an exemplary embodiment of the present invention, and FIG. 2 is an exemplary view showing a state in which the stretchable substrate of FIG. 1 is stretched.

As shown in FIGS. 1 and 2, the stretchable substrate may include a substrate body 100, a cell 200, a cut portion, and an extended cutting line 340.

Here, a plurality of cells 200 may be formed in the substrate body 100, and devices may be mounted on the cells 200a, 200b, 200c, and 200d, respectively.

The cut portion may be formed in the substrate body 100 such that an interval between the cells 200a, 200b, 200c, and 200d increases when the substrate body 100 is stretched.

In addition, the extended cutting line 340 may be formed to extend to be bent inwardly of the cells 200a, 200b, 200c, and 200d from an end portion of the cut portion so that the corners of the cells 200a, 200b, 200c, and 200d are rounded.

In detail, the cut portion may have a first basic cutting line 310, a second basic cutting line 320, and a sub-cutting line 330.

The first basic cutting line 310 may be formed in the substrate body 100 in a first direction A1. The first basic cutting line 310 may be formed to pass through upper and lower surfaces of the substrate body 100.

The second basic cutting line 320 may be symmetrically formed on both sides of the center of the first basic cutting line 310 in a second direction A2 intersecting the first direction A1 in the substrate body 100. The second basic cutting line 320 may be formed not to be connected to the first basic cutting line 310. That is, based on the first basic cutting line 310, an imaginary straight line extending to connect the second basic cutting line 320 formed on both sides of the first basic cutting line 310 may pass through the center of the first basic cutting line 310.

The cells 200a, 200b, 200c, and 200d may be formed as regions divided by the first basic cutting line 310 and the second basic cutting line 320 in the substrate body 100. That is, cells 200a, 200b, 200c, and 200d may be formed in the quadrants Q1, Q2, Q3, and Q4 based on the first basic cutting line 310 and the second basic cutting line 320, respectively.

A plurality of sub-cutting lines 330 may be formed, and may be formed to extend along the edges of the cells 200a, 200b, 200c, and 200d inside the cells 200a, 200b, 200c, and 200d.

Figure 3:
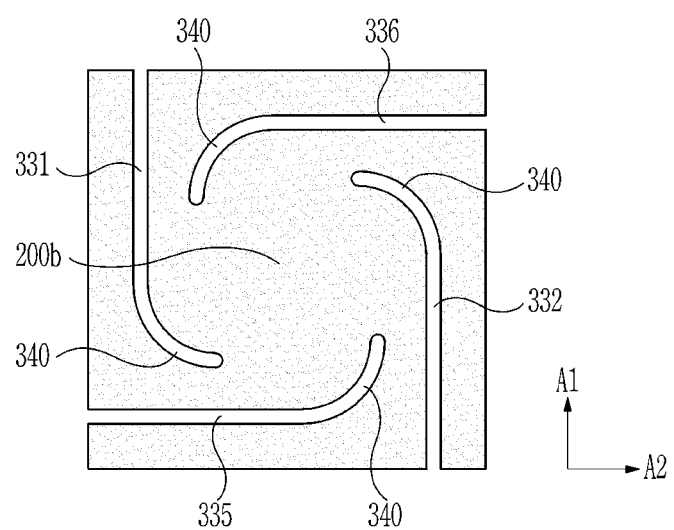
FIG. 3 is an exemplary view showing a cell formed in a second quadrant of the stretchable substrate of FIG. 1.

FIG. 3 is an exemplary view showing a cell formed in the second quadrant of the stretchable substrate of FIG. 1.

As shown in FIG. 3, the sub-cutting line 330 may be formed to extend along the edge of the cell 200 inside the cell 200. In addition, the sub-cutting lines 330 may be provided to be spaced apart from each other without being connected to each other.

The sub-cutting line 330 may have a pair of first sub-cutting lines 331 and 332 and a pair of second sub-cutting lines 335 and 336.

The pair of first sub-cutting lines 331 and 332 may be formed to extend from the inside of the cell 200 in the first direction A1 along the edge of the cell 200. In addition, the pair of second sub-cutting lines 335 and 336 may be formed to extend from the inside of the cell 200 along the edge of the cell 200 in the second direction A2.

The extended cutting line 340 may be formed at an end portion of each of the sub-cutting lines 331, 332, 335, and 336. The extended cutting line 340 may be formed to extend to be bent inwardly of the cell 200. Preferably, the extended cutting line 340 may be formed to be bent in a direction perpendicular to an extension direction of the sub-cutting line to which the extended cutting line 340 is connected. For example, the extended cutting line 340 extending from the first sub-cutting lines 331 and 332 may be bent in the second direction A2. In addition, the extended cutting line 340 extending from the second sub-cutting line 335 and 336 may be formed to be bent in the first direction A1. Accordingly, the corner of the cell 200 may be formed to be rounded. When the corner of the cell 200 is rounded by the extended cutting line 340, a tensile force may be provided to the substrate body 100, so that when the substrate body 100 is stretched, a progress direction of cracks that may occur due to the concentration of stress based on deformation of the substrate body 100 may not be directed to the cut portion but to the inside of the cell.

Accordingly, a phenomenon in which the cut portion is cut may be reduced, and the effect of improving durability of the stretchable substrate may be obtained.

In addition, all the extended cutting lines 340 formed in the corresponding cell 200b may be formed to extend to be bent in the same rotation direction.

Here, referring to FIGS. 1 and 2, the extended cutting line 340 formed in the cells 200a and 200c formed in the first quadrant Q1 and the third quadrant Q3 may extend to be bent in the first rotation direction (when referred to the drawings, in a clockwise direction). In addition, the extended cutting line 340 formed in the cells 200b and 200d formed in the second quadrant Q2 and the fourth quadrant Q4 may be bent in a second rotation direction (when referred to the drawings, counterclockwise direction) opposite to the first rotation direction.

Referring back to FIGS. 1 and 3, among the first sub-cutting lines 331 and 332, the first sub-cutting line 332 disposed closer to the first basic cutting line 310 may be connected to the second basic cutting line 320 vertically.

In addition, the second sub-cutting line 336 disposed farther from the second basic cutting line 320, among the second sub-cutting lines 335 and 336, may be vertically connected to the first basic cutting line 310.

Through this, tensile force may be provided to the substrate body 100 so that when the substrate body 100 is stretched, the first basic cutting line 310, the second basic cutting line 320, the sub-cutting line 330, and the extended cutting line 340 may be spread out, and accordingly, the cells 200a and 200c formed in the first quadrant Q1 and the third quadrant Q3 may be rotated counterclockwise and the cells 200b and 200d formed in the second quadrant Q2 and the fourth quadrant Q4 may be rotated clockwise direction and the interval between the centers of the respective cells 200a, 200b, 200c, and 200d may be spaced apart equally from each other. In addition, when tensile force provided to the substrate body 100 is removed, the first basic cutting line 310, the second basic cutting line 320, the sub-cutting line 330, and the extended cutting line may be returned to an initial form by a restoring force of the substrate body 100, so that the cells 200a and 200c formed in the first quadrant Q1 and the third quadrant Q3 are rotated clockwise and the cells 200b and 200d formed in the second quadrant Q2 and the fourth quadrant Q4 may be rotated counterclockwise, and accordingly, the intervals between the centers of the respective cells 200a, 200b, 200c, and 200d may decrease to be close to each other and restored to the initial state as shown in FIG. 1.

Figure 4:
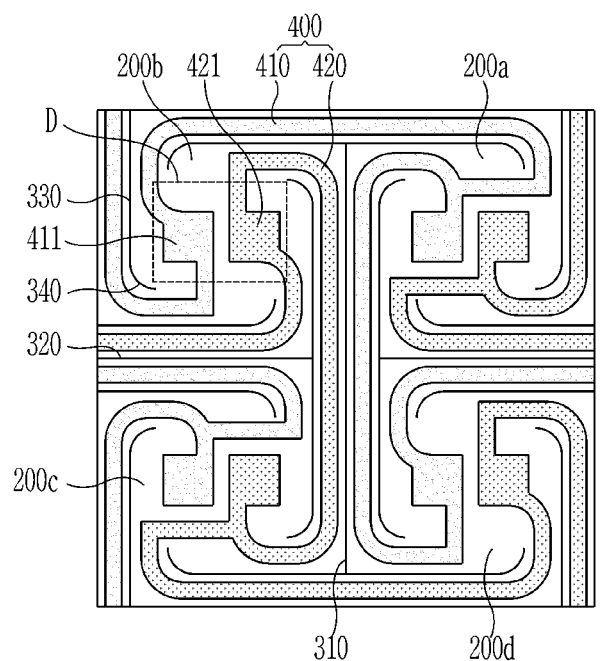
FIG. 4 is an exemplary view illustrating a state in which an electrode wiring is provided on the stretchable substrate of FIG. 1.

FIG. 4 is an exemplary view illustrating a state in which an electrode wiring is provided on the stretchable substrate of FIG. 1.

As shown in FIG. 4, an electrode wiring 400 may be continuously provided on the plurality of cells 200a, 200b, 200c, and 200d not to intersect the first basic cutting line 310, the second basic cutting line 320, the sub-cutting line 330, and the extended cutting line 340, and may maintain the continuous state even when the cells 200a, 200b, 200c, and 200d are hinge-rotated.

The electrode wiring 400 may have a first circuit line 410 and a second circuit line 420, and voltages having different polarities may be applied to the first circuit line 410 and the second circuit line 420.

The first circuit line 410 and the second circuit line 420 may be formed along the sides of the cells so as to pass through a connection portion connecting the neighboring cells. Since the first circuit line 410 and the second circuit line 420 are not connected to each other, there is no risk of a short circuit.

In addition, the electrode wiring 400 may further include a first electrode 411 and a second electrode 421.

The first electrode 411 may be connected to the first circuit line 410 and may be provided at an inner central portion of the corresponding cell. In addition, the second electrode 421 may be connected to the second circuit line 420 and be provided at an inner central portion of the corresponding cell. The first electrode 411 and the second electrode 421 may be provided to form a pair in each of the cells 200a, 200b, 200c, and 200d, and a device D may be mounted on the first electrode 411 and the second electrode 421. The first electrode 411 and the second electrode 421 may be provided in the same direction. Referring to FIG. 4, the first electrode 411 may be provided on the left side, and the second electrode 421 may be provided on the right side. In this manner, since the first electrode 411 and the second electrode 421 are provided in the same direction, a mounting direction of the device may be uniformly managed, obtaining an advantage in a manufacturing process.

The electrode wiring 400 may be first patterned and provided on the substrate body portion 100, and then the device is mounted, and thereafter, the first basic cutting line 310, the second basic cutting line 320, and the sub-cutting line 330, and the extended cutting line 340 may be cut.

Figure 5A:
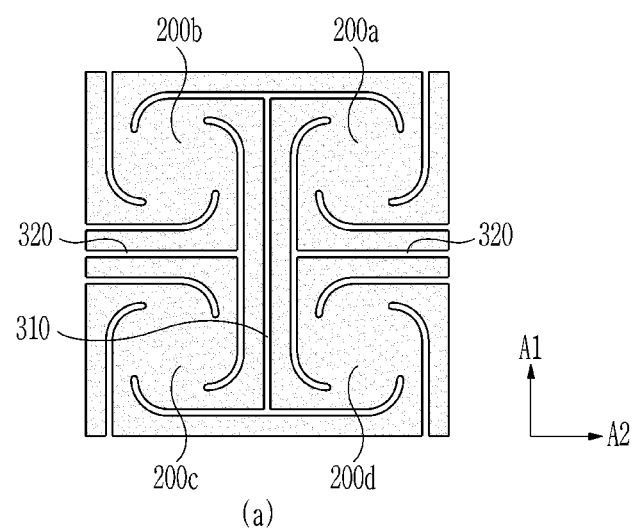
FIG. 5 is a diagram illustrating strain analysis of a stretchable substrate according to the present invention.
Figure 5B:
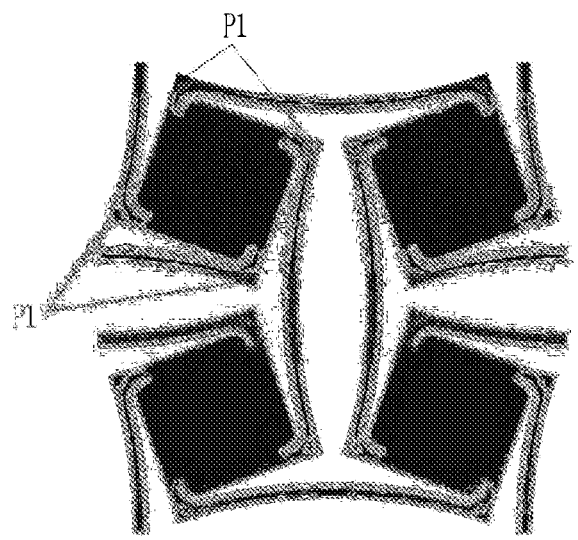
Figure 6A:
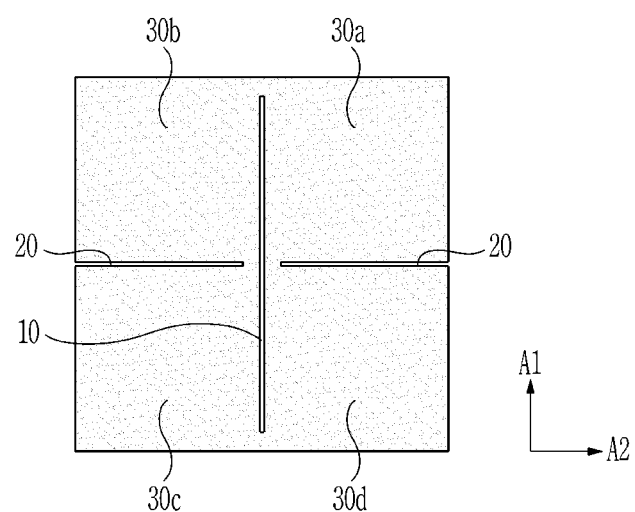
FIG. 6 is an exemplary view showing Comparative Example 1.
Figure 6B:
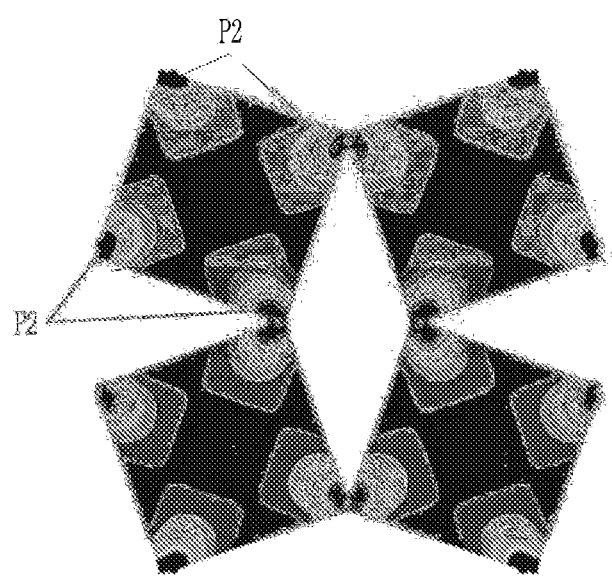

FIG. 5 is a diagram showing strain analysis of a stretchable substrate according to the present invention, in which (a) of FIG. 5 shows a stretchable substrate according to the present invention and (b) FIG. 5 is strain analysis in a state in which a stretchable substrate is stretched. FIG. 6 is an exemplary view showing Comparative Example 1, in which (a) of FIG. 6 shows a stretchable substrate of Comparative Example 1 and (b) of FIG. 6 shows strain analysis in a state in which the stretchable substrate of (a) of FIG. 5 is stretched.

The stretchable substrate of FIG. 6 has first and second cutting lines 10 and 20 corresponding to the first and second basic cutting lines of the stretchable substrate of FIG. 5. The stretchable substrate of FIG. 5 and the stretchable substrate of FIG. 6 are formed from the same material and have the same thickness and the same size.

Both (b) of FIG. 5 and (b) of FIG. 6 show strain analysis occurring when the stretchable substrate is subjected to a 30% stretching deformation in two axes of the first direction A1 and the second direction A2.

As shown in (b) of FIG. 5, when the stretchable substrate according to the present invention was stretched to be deformed by 30% in two axes of the first direction A1 and the second direction A2, a maximum strain at a hinge point P1 where the largest deformation occurs was 2.4%.

Meanwhile, as shown in (b) of FIG. 6, when the stretchable substrate of Comparative Example 1 was stretched to be deformed by 30% in two axes of the first direction A1 and the second direction A2, a maximum strain at a hinge point P2 where the largest deformation occurs was 57.4%. In view of this, in the stretchable substrate according to the present invention, the maximum strain at the hinge point where the largest strain occurs during stretching deformation may be significantly lowered, and accordingly, stress at the hinge point may be reduced, thus lowering the risk of breakage.

In addition, since the stretchable substrate according to the present invention may have such a low maximum strain, greater stretching deformation than Comparative Example 1 may be achieved. That is, referring to the fact that, in Comparative Example 1, even with the maximum strain of 57.4% at the hinge point P2, breakage did not occur, no breakage is expected even with the maximum strain of 57.4% at the hinge point P1 of the stretchable substrate of the present invention. Therefore, the stretchable substrate of the present invention may be stretched to be deformed in excess of 30%, and accordingly, the distance between the cells 200a, 200b, 200c, and 200d may be greater than the distance between the cells 30a, 30b, 30c, and 30d of Comparative Example 1, and accordingly, the allowable stretch rate of the display may be increased, thereby implementing a large-area display through stretching. In this manner, the stretchable substrate according to the present invention may have a lower rate of breakage while allowing greater stretching deformation.

Meanwhile, when a thickness of the substrate body 100 is t, as shown in FIG. 1, preferably, a ratio of an interval h between end portions of the sub-cutting line 330 and the extended cutting line 340 adjacent to the sub-cutting line 330 and the thickness t of the substrate body 100, that is, h/t, is greater than 1.

In addition, an interval h between the first basic cutting line 310 and the sub-cutting line 330 adjacent to the first basic cutting line 310 and an interval h between the second basic cutting line 320 and the sub-cutting line 330 adjacent to the second basic cutting line 320 may be the same as the interval h between the end portions of the sub-cutting line 330 and the extended cutting line 340 adjacent to the sub-cutting line 330 described above, and h/t may exceed 1.

Figure 7:
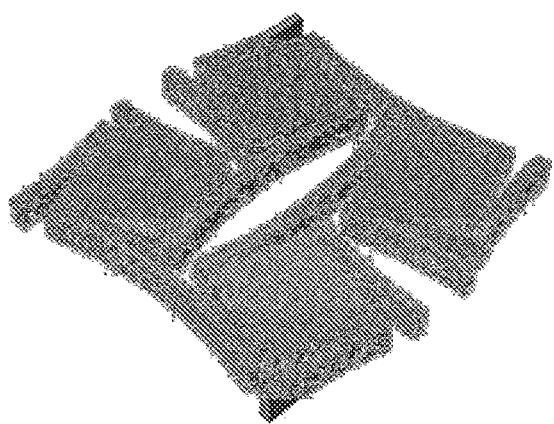
FIG. 7 is an exemplary view comparing a twisting phenomenon in an out-of-plane direction of a stretchable substrate according to the present invention and Comparative Example 2.
Figure 7:
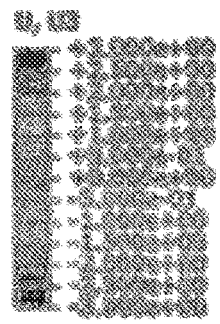
Figure 7:
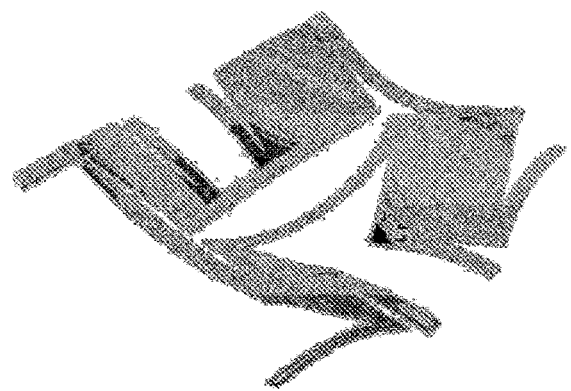
Figure 7:
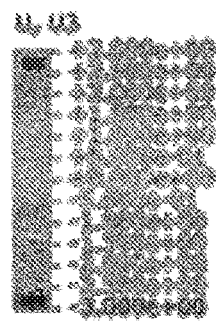

FIG. 7 is an exemplary view comparing twisting phenomena in an out-of-plane direction of the stretchable substrate according to the present invention and Comparative Example 2, in which (a) of FIG. 7 shows the case of the stretchable substrate according to the present invention and (b) of FIG. 7 shows the case of Comparative Example 2. In the stretchable substrate according to the present invention, h/t is 2.0, and in Comparative Example 2, h/t is 0.2.

First, as shown in (a) of FIG. 7, in a case in which h/t exceeds 1 in 2.0, when 30% of stretching deformation is generated in two axes of the first and second directions, an out-of-plane distortion does not occur. The example shows a relative displacement of the substrate in the vertical direction before and after deformation of the stretchable substrate. Referring to this example, the stretchable substrate does not have a difference in height in a height direction.

However, as shown in (b) of FIG. 7, in the case in which h/t is 0.2 and does not exceed 1, when 30% stretching deformation is generated in two axes of the first direction and the second direction, a severe out-of-plane distortion occurs. That is, the stretchable substrate has a difference in height in the height direction. The difference in height is considered to occur as a bending moment in an in-plane direction between the cutting lines is smaller than a bending moment in the out-of-plane direction if h/t does not exceed 1. When distortion occurs, the horizontality of the devices mounted in each cell is also broken, and thus, display performance may be affected.

The stretchable device according to the present invention is formed to have h/t exceeding 1, so that such a problem may not arise.

In addition, in the stretchable substrate according to the present invention, since the corner of the cell 200 is rounded by the extended cutting line 340, an effect of increasing the interval h at the front end of the extended cutting line 340 may also be achieved. Therefore, based on the substrate body having the same thickness t, the value h/t may increase, and through this, the effect of further reducing distortion may be realized.

Figure 8:
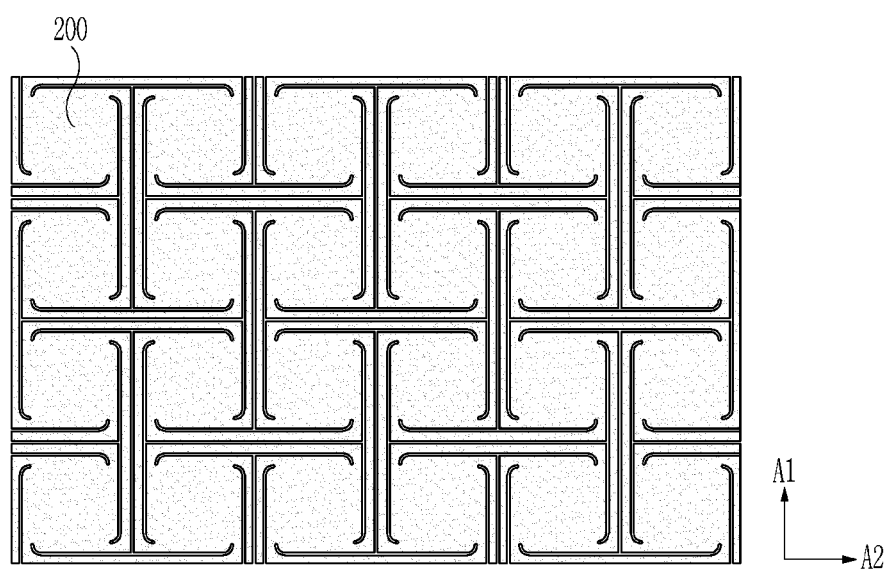
FIG. 8 is an exemplary view illustrating a state in which the stretchable substrate of FIG. 1 is expanded.
Figure 9:
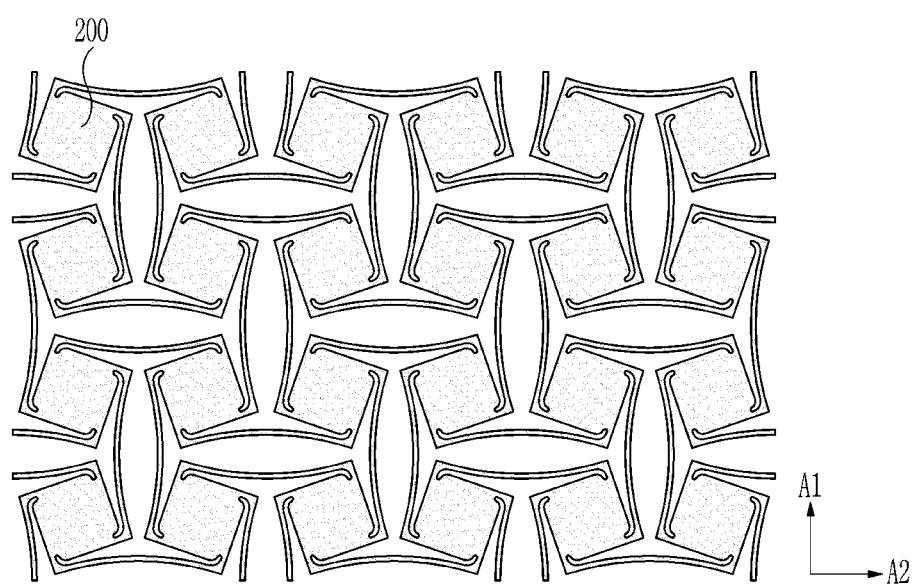
FIG. 9 is an exemplary view illustrating a state in which the stretchable substrate of FIG. 8 is stretched.

FIG. 8 is an exemplary view illustrating a state in which the stretchable substrate of FIG. 1 is expanded, and FIG. 9 is an exemplary view illustrating a state in which the stretchable substrate of FIG. 8 is stretched.

As shown in FIGS. 8 and 9, the form of the stretchable substrate described in FIGS. 1 and 2 is a basic pattern unit, and the basic pattern unit is repeatedly provided in the first direction A1 and the second direction A2, thereby expanding to a large-area stretchable substrate. Even in the expanded stretchable substrate, when tensile force is applied from the outside, the same stretching deformation may occur in the first direction A1 and the second direction A2, and the interval between the cells 200 may be adjusted to be the same.

The above description of the example exemplary embodiments is provided for the purpose of illustration, and it would be understood by those skilled in the art that various changes and modifications may be made without changing technical conception and essential features of the example exemplary embodiments. Thus, it should be understood that the above-described example exemplary embodiments are illustrative in all aspects and do not limit the present invention. For example, each component described to be of a single type may be implemented in a distributed manner. Likewise, components described to be distributed may be implemented in a combined manner.

The scope of the present invention is defined by the appended claims, rather than the detailed description, and should be construed as including all modifications and variations derived from the meaning and scope of the claims and concept equivalent thereto.

DESCRIPTION OF REFERENCE NUMERALS

100: Substrate body
200: cell
310: first basic cutting line
320: second basic cutting line
330: sub-cutting line
340: extended cutting line
400: electrode wiring

The invention claimed is:

1. A stretchable substrate comprising: a plurality of cells formed in a substrate body allowing a device to mounted thereon; a cut portion formed in the substrate body to increase a distance between the cells when the substrate body is stretched; and an extended cutting line extending from an end portion of the cut portion and bent inwardly of the cells cell so that corners of the cells are rounded, wherein: the cut portion includes: a first basic cutting line formed on the substrate body in a first direction: a second basic cutting line formed on the substrate body in a second direction intersecting the first direction, wherein the second basic cutting line includes a first portion and a second portion that are symmetrically disposed on both sides of the first basic cutting line and are spaced apart from each other with interposing the first basic cutting line, and the second basic cutting line is spaced apart from the first basic cutting line; and a plurality of sub-cutting lines extending along the edge of the cell in an inside of the cell and not connected to each other but spaced apart from each other, wherein the extended cutting line is formed at an end portion of each of the sub-cutting lines; wherein, the extended cutting line formed in cells formed in first and third quadrants based on the first and second basic cutting lines.

2. The stretchable substrate of claim 1, wherein: among the plurality of cells, the extended cutting line extends to be bent in a first rotation direction; and the extended cutting line formed in cells formed in second and fourth quadrants based on the first and second basic cutting lines, among the plurality of cells, extends to be bent in a second rotation direction.

3. The stretchable substrate of claim 1, wherein:
 a ratio of a thickness of the substrate body to a distance between portions of the sub-cutting lines and the extended cutting line adjacent to the sub-cutting lines is greater than 1.

4. The stretchable substrate of claim 1, wherein:

the sub-cutting lines include:

a pair of first sub-cutting lines extending from the inside of the cell in the first direction along the edge of the cell and a pair of second sub-cutting lines extending from the inside of the cell in the second direction along the edge of the cell, wherein a first sub-cutting line disposed closer to the first basic cutting line, among the first sub-cutting lines, is vertically connected to the second basic cutting line, and a second sub-cutting line disposed farther from the second basic cutting line, among the second sub-cutting lines, is vertically connected to the first sub-cutting line.

5. The stretchable substrate of claim 1, wherein:

an electrode wiring is continuously provided on the plurality of cells not to cross the cut portion, and the electrode wiring maintains a continuous state even when an interval between the cells is changed.

* * * * *